US007138884B2

(12) United States Patent
Cheung et al.

(10) Patent No.: US 7,138,884 B2

(45) Date of Patent: Nov. 21, 2006

(54) CIRCUIT PACKAGE INTEGRATING PASSIVE RADIO FREQUENCY STRUCTURE

(75) Inventors: Philip Cheung, Roseville, MN (US); Ramesh Harjani, Minneapolis, MN (US)

(73) Assignee: DSP Group Inc., Santa Clara, CA (US)

( * ) Notice: Subject to any disclaimer, the term of this patent is extended or adjusted under 35 U.S.C. 154(b) by 146 days.

(21) Appl. No.: 10/444,049

(22) Filed: May 22, 2003

(65) Prior Publication Data

US 2004/0032308 A1 Feb. 19, 2004

Related U.S. Application Data

(60) Provisional application No. 60/404,443, filed on Aug. 19, 2002.

(51) Int. Cl.
*H10P 5/107* (2006.01)

(52) U.S. Cl. .......................................... 333/26; 333/33

(58) Field of Classification Search ................ 333/333, 333/117, 25–33, 54; 348/731; 455/78–85
See application file for complete search history.

(56) References Cited

U.S. PATENT DOCUMENTS

| | | | | |
|---|---|---|---|---|
| 4,340,975 | A | 7/1982 | Onishi et al. | |
| 4,476,574 | A * | 10/1984 | Struven | 455/523 |
| 4,586,007 | A * | 4/1986 | Ciszek | 333/175 |
| 4,994,755 | A * | 2/1991 | Titus et al. | 330/54 |
| 5,025,232 | A * | 6/1991 | Pavio | 333/26 |
| 5,060,298 | A * | 10/1991 | Waugh et al. | 330/54 |
| 5,093,667 | A | 3/1992 | Andricos | |
| 5,239,685 | A | 8/1993 | Moe et al. | |
| 5,491,449 | A * | 2/1996 | Johnson et al. | 330/269 |
| 5,521,650 | A * | 5/1996 | Ku | 348/731 |
| 5,886,589 | A * | 3/1999 | Mourant | 333/26 |
| 6,018,277 | A | 1/2000 | Vaisanen | |
| 6,040,745 | A | 3/2000 | Tanaka et al. | |
| 6,097,273 | A * | 8/2000 | Frye et al. | 333/25 |
| 6,133,806 | A * | 10/2000 | Sheen | 333/26 |
| 6,140,886 | A * | 10/2000 | Fratti et al. | 333/26 |
| 6,177,796 | B1 * | 1/2001 | Viti | 324/314 |
| 6,201,439 | B1 | 3/2001 | Ishida et al. | |
| 6,252,460 | B1 * | 6/2001 | Ito | 330/301 |
| 6,274,937 | B1 | 8/2001 | Ahn et al. | |
| 6,278,340 | B1 * | 8/2001 | Liu | 333/26 |
| 6,335,564 | B1 | 1/2002 | Pour | |

(Continued)

OTHER PUBLICATIONS

Wartenberg, Scott A., "Fundamentals of RFIC Package Characterization," Agilent Technologies, 2001, no date.

(Continued)

*Primary Examiner*—Lam T. Mai
(74) *Attorney, Agent, or Firm*—Shumaker & Sieffert, P.A.

(57) ABSTRACT

In general, the invention is directed to integration of passive radio frequency (RF) structures with at least one integrated circuit in a single integrated circuit (IC) package. An IC package in accordance with the invention may include, for example, a radio IC, a digital IC, a passive radio frequency balun as well as additional passive RF structures or ICs. Additionally, passive electronic components may further be incorporated in the IC package. For example, the IC package may include a resistor, capacitor, inductor or the like. The components of the IC package may be distributed throughout layers of a multi-layer IC package, such as a multi-layer ceramic package. The different ICs and the passive RF structures may be electrically coupled via conductive traces, which may be varied in thickness and length in order to match input and output impedances of the different ICs and passive RF structures.

44 Claims, 7 Drawing Sheets

U.S. PATENT DOCUMENTS

| | | | | |
|---|---|---|---|---|
| 6,351,192 | B1 * | 2/2002 | Sheen | 333/26 |
| 6,377,464 | B1 | 4/2002 | Hashemi et al. | |
| 6,380,821 | B1 * | 4/2002 | Imbornone et al. | 333/26 |
| 6,393,362 | B1 * | 5/2002 | Burns | 701/301 |
| 6,396,122 | B1 | 5/2002 | Howard et al. | |
| 6,396,362 | B1 * | 5/2002 | Mourant et al. | 333/25 |
| 6,424,027 | B1 | 7/2002 | Lamson et al. | |
| 6,437,658 | B1 * | 8/2002 | Apel et al. | 333/26 |
| 6,653,910 | B1 * | 11/2003 | Escalera et al. | 333/26 |
| 6,655,964 | B1 * | 12/2003 | Fork et al. | 439/55 |
| 6,683,510 | B1 * | 1/2004 | Padilla | 333/26 |
| 6,750,741 | B1 * | 6/2004 | Mordkovich | 333/204 |
| 6,759,920 | B1 | 7/2004 | Cheung et al. | |
| 6,768,399 | B1 * | 7/2004 | Uriu et al. | 333/204 |
| 6,819,199 | B1 * | 11/2004 | Burns et al. | 333/26 |
| 6,848,175 | B1 * | 2/2005 | Fork et al. | 29/842 |
| 6,937,845 | B1 * | 8/2005 | Watanabe et al. | 455/83 |
| 6,968,019 | B1 * | 11/2005 | Darabi et al. | 375/316 |
| 2002/0113682 | A1 | 8/2002 | Gevorgian et al. | |

OTHER PUBLICATIONS

Philips Semiconductors' QUBiC4 Process Technology, Backgrounder, www.semiconductors.philips.com, Koninklijke Philiips Electronics N.V., 2003, no date.

Wambacq, P., "Chip-Package Co-Design of a 5 GHz RF Front-End for WLAN," ISCC Digest of Technical Paper, Session WAM 19, Paper 19.1, IMEC, Belgium, Feb. 2000.

Seeger, David, "Integrated Passive Components for RF Wireless Communications," EE Times, Mar. 2000.

Huschens, Markus, "High RF Circuitry Integration with LTCC Technology," Murata Europe Management GmbH/ Murata Manufacturing Co., Ltd., Oct. 2002.

Bushyager et al., "Multilayer Package Modeling Using the Multi-Resolution Time Domain Technique," School of ECE, Georgia Institute of Technology, Atlanta, GA, 4 pages, date unknown.

* cited by examiner

CIRCUIT PACKAGE INTEGRATING PASSIVE RADIO FREQUENCY STRUCTURE

This application claims priority from U.S. Provisional Application Ser. No. 60/404,443, filed Aug. 19, 2002, the entire content of which is incorporated herein by reference.

TECHNICAL FIELD

The invention relates to integrated circuit packages and, more particularly to integrated circuit packages for radio frequency communication devices.

BACKGROUND

A circuit package carries a semiconductor device and provides necessary input/output (I/O) interconnections between the semiconductor device and other circuit components. A typical integrated circuit package is designed to provide structure to support and protect the device, and to distribute circuit-generated heat. Furthermore, the integrated circuit package provides connections for signal lines leading into and out of the device, connections that present varying potentials for power and ground, and a wiring structure for I/O signal interconnections within a system.

SUMMARY

In general, the invention is directed to integration of passive radio frequency (RF) structures with at least one integrated circuit device in a common integrated circuit (IC) package. As will be described herein, an IC package that incorporates passive RF structures with ICs may achieve a low profile, i.e., thickness, compactness, as well as increased IC performance.

An IC package in accordance with the invention may include, for example, a radio IC, a digital IC, a passive radio frequency balun as well as additional passive RF structures or ICs. Other passive RF structures that may be incorporated in the IC package along with the balun, radio IC and digital IC include passive RF filters and the like. Additionally, passive electronic components may further be incorporated in the IC package. For example, the IC package may include a resistor, capacitor, inductor or the like.

The IC package may be a multi-layer IC package, such as a multi-layer ceramic package, with the internal components, e.g., passive RF structures and ICs, distributed throughout the different layers. The different ICs and the passive RF structures may be conductively coupled via conductive traces formed on the layers, as well as conductive vias that extend between different package layers. Conductively coupling the passive structures RF structures and the different ICs using conductive traces or vias within the package facilitates input and output impedance matching of the different ICs and passive RF structures. For example, the conductive strips may conductively couple the radio IC and the digital IC and have varying lengths and widths to match the input and output impedances of the radio IC and the digital IC.

In one embodiment, the invention provides a circuit package comprising at least one integrated circuit device and a passive balun, the integrated circuit device being coupled to the passive balun.

In another embodiment, the invention provides an integrated circuit package comprising a radio integrated circuit that converts radio frequency signals to baseband signals, a digital integrated circuit that processes the inbound and outbound baseband frequency signals, and a passive structure coupled to the radio integrated circuit.

The invention may provide one or more advantages. In general, integrating passive RF structures along with ICs into a common IC package facilitates a low profile, i.e., thin, IC package while allowing for a large number of input and output connections. Further, interconnecting the internal components, e.g., the different ICs and the passive RF structures, with conductive traces facilitates matching of the input and output impedances of the internal components. For example, the thickness of the conductive traces may be varied to match impedance between a pair of ICs.

In addition, because the variance of the dimension of the conductive traces within the package is typically low, the variance on the overall performance of the IC package is low. The low variance facilitates increased performance of the ICs, maintenance of that performance over a high production volume. The multi-layer structure of the IC package permits integration of power planes and ground planes in close proximity to the ICs. This proximity reduces the amount of distortion in the ICs by reducing the parasitic effects associated with surface mounting high speed or high frequency ICs on a printed circuit structure.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
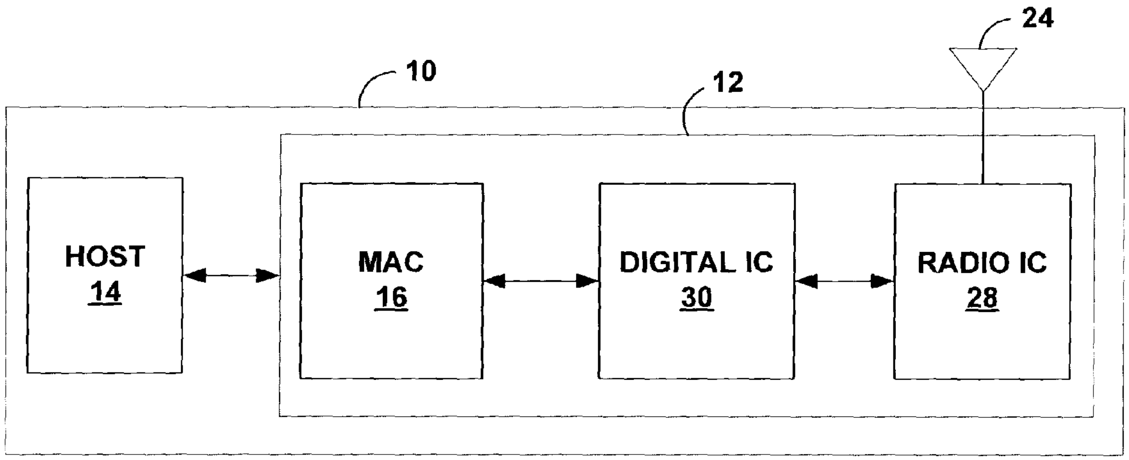
FIG. 1 is a block diagram illustrating a mobile communication device.

FIG. 1 is a block diagram illustrating a mobile communication device 10. Mobile communication device 10 may communicate with a wired network as well as one or more other mobile communication devices via a wireless communication network. For example, the wireless communication network may include at least one wireless access point coupled to a wired network. The wireless access point permits wireless communication between the wired network and mobile computing device 10. The wireless access point and mobile computing device 10 may communicate according to one or more Wireless Local Area Network (WLAN) protocols such as those specified by the IEEE 802.11a, 802.11b, 802.11e or 802.11g standards.

Mobile computing device 10 may take a variety of forms including a desktop computer, portable computer, personal digital assistant (PDA), mobile telephone, multimedia device, consumer electronics and the like. Mobile computing device 10 is equipped with hardware to provide attachment to the wireless communication network. For example, mobile communication device 10 may include a peripheral device 12, such as a wireless network card or board coupled to a host computer via an external or internal interface, including Peripheral Component Interconnect (PCI), Mini PCI, Universal Serial Bus (USB), USB-2, Cardbus, IEEE 1394, Small Computer System Interface (SCSI), or Personal Computer Memory Card International Association (PCMCIA) interfaces.

More specifically, mobile computing device 10 includes a host 14 coupled to a peripheral device 12. Particularly, host 14 is coupled to a media access control (MAC) 16 via a host interface (not shown). MAC 16 is further coupled to a digital integrated circuit (IC) 28 via a physical interface. Mobile computing device further includes a radio integrated circuit (IC) 30 and a radio frequency (RF) antenna 24. MAC 16, digital IC 28 and radio IC 30 are all incorporated within peripheral device 12.

RF antenna 24 transmits and receives RF signals between device 10 and the access point within wireless communication network. Although FIG. 1 depicts the use of a single antenna 24, device 10 may include more than one RF antenna 24 to make use of receive and transmit diversity. Radio IC 30 and digital IC 28 function together as a wireless transceiver. Particularly, radio IC 30 may include circuitry for upconverting signals from baseband to RF for transmission, and downconverting received RF signals to baseband for processing by digital IC 28. Digital IC 28 handles baseband processing of packets transmitted and received via radio IC 30 and antenna 24. Digital IC 28 may, for example, encode and decode information carried by packets transmitted and received via radio IC 30 and antenna 24.

MAC 16 interacts with host 14 to facilitate communication between digital IC 28 and applications running on host 14. Hence, host 14 may be a CPU within a computer, PDA, mobile telephone or some other device. MAC 16, digital IC 28, and radio IC 30 may be on a common integrated circuit chip. The common integrated package that includes MAC 16, digital IC 28 and radio IC 30 may further integrate passive RF structures, such as a balun, in accordance with the invention.

Although the techniques of the invention are described for a mobile communication system operating in the RF frequency range, the techniques may be applied to other types of communication systems that operate in different frequency ranges.

Figure 2:
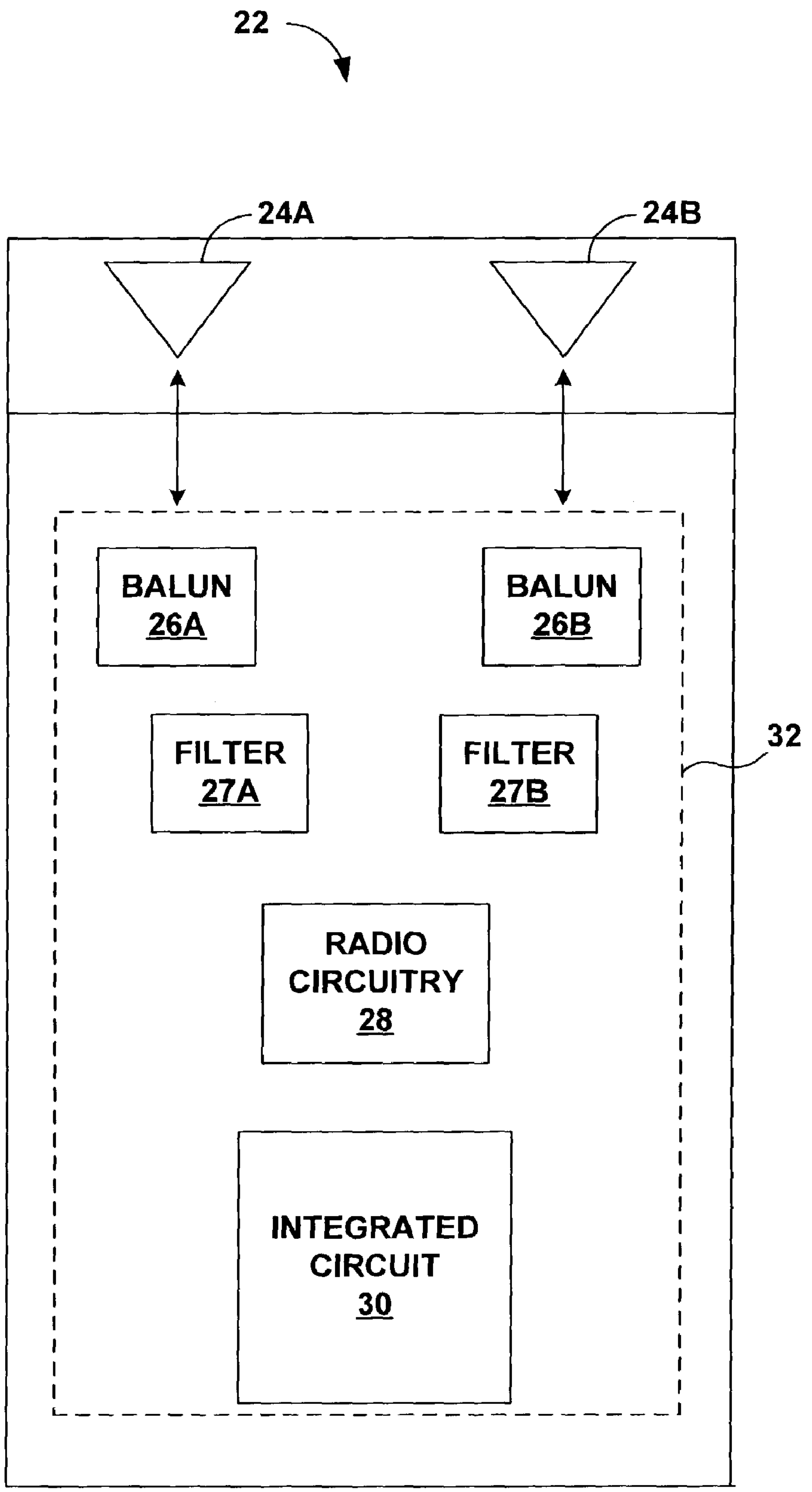
FIG. 2 is a schematic diagram illustrating a wireless card for wireless communication.

FIG. 2 is a schematic diagram illustrating a wireless card 22 for wireless communication. Wireless card 22 is just one example of a peripheral device 12 that may incorporate the techniques of the invention. Wireless card 22 includes antennas 24A and 24B (hereinafter 24), passive RF baluns 26A and 26B (hereinafter 26), passive RF filters 27A and 27B (hereinafter 27), a radio integrated circuit (IC) 28 and a digital integrated circuit (IC) 30. In accordance with the invention, baluns 26, radio IC 28 and digital IC 30 may all be incorporated into a single circuit package 32.

As described above, antennas 24 receive and transmit signals to and from wireless card 22. Antennas 24 may, for example, receive signals over multiple receive paths providing wireless card 22 with receive diversity. In this manner, antenna 24A provides a first receive path, and antenna 24B provides a second receive path.

Wireless card 22 may select, via radio IC 28, the receive path with the strongest signal. Alternatively, wireless card 22 and, more particularly, radio IC 28 may combine the signals from the two receive paths. More than two antennas 24 may be provided in some embodiments for enhanced receive diversity. Alternatively, only a single antenna 24 may be provided in which case wireless card 22 does not make use of receive diversity. One or both of antennas 24 may further be used for transmission of signals from wireless card 22.

As described above, radio IC 28 may include transmit and receive circuitry (not shown). For example, radio IC 28 may include circuitry for upconverting transmitted signals to radio frequency (RF), and downconverting RF signals to a baseband frequency for processing by digital IC 30. In this sense, radio IC 28 may integrate both transmit and receive circuitry within a single transceiver component. In some cases, however, transmit and receive circuitry may be formed by separate transmitter and receiver components, e.g., a receive IC and a transmit IC.

Baluns 26 couple antennas 24 with radio IC 28. Specifically, balun 26A couples antenna 24A with radio IC 28 and balun 26B couples antenna 24B with radio IC 28. Baluns 26 may transform unbalanced (or single-ended) RF signals from radio IC 28 to balanced (or differential) RF signals for antennas 24 and vice versa, i.e., balanced RF signals from antennas 24 to unbalanced RF signals for radio IC 28. In some embodiments, however, radio IC 28 may produce balanced signals and antennas 24 may produce unbalanced signals. Baluns 26 may perform impedance transformations in addition to conversions from balanced signals to unbalanced signals. Further, baluns 26 may provide filtering functionality to inbound and outbound signals. Baluns 26 may electrically couple to antennas 24, e.g., via a conductive strip. Alternatively, baluns 26 may electromagnetically couple to antennas 24.

In addition, filters 27 may be coupled to baluns 26. Filters 27 may be used to provide filtering in the cases in which baluns 26 do not provide filtering functionality. Alternatively, in the case in which baluns 26 do provide filtering functionality, filters 27 may sharpen the filtering functionality provided by baluns 26. As will be described, filters 27 may include hairpin filters, notch filters or any other types of filters.

As described in FIG. 1, digital IC 30 processes inbound and outbound signals and may include a baseband processor and medium access control (MAC) layer hardware. Digital IC 30 may, for instance, encode information in a baseband signal for upconversion to RF by radio IC 28 or decode information from RF signals received via antennas 24 and downconverted to baseband by radio IC 28. For example, digital IC 30 may provide Fourier transform processing to demodulate signals received from a wireless communication network. Although in the example illustrated in FIG. 2 radio IC 28 and digital IC 30 are discrete ICs, wireless card 22 may incorporate a single component that integrates radio IC 28 and digital IC 30 onto a common IC.

As described above, baluns 26, filters 27, radio IC 28 and digital IC 30 may all be incorporated into IC package 32. For example, IC package 32 may be a multi-layer ceramic package that incorporates baluns 26 and filters 27, i.e., passive RF structures, with radio IC 28 and digital IC 30. The passive RF structures, e.g., baluns 26 and filters 27, may reside on the same layer of IC package 32 as radio IC 28 and digital IC 30. Alternatively, all or a portion of the passive RF structures may reside on different layers than layers on which radio IC 28 and digital IC 30 reside. Although in the example of FIG. 2 the only passive RF structures incorporated into IC package 32 are baluns 26 and filters 27, other passive RF structures may be integrated into IC package 32. For example, IC package 32 may include other passive RF structures such as a coupler (e.g., a line coupler or a quadrature coupler), as well as passive electronic components such as resistors, capacitors, and inductors.

Wireless card 22 illustrated in FIG. 2 should be taken as exemplary of the type of device in which the invention may be embodied, however, and not as limiting of the invention as broadly embodied herein. For example, the invention may be practiced in a wide variety of devices, including WLAN cards, cellular phones, personal computers (PCs), personal digital assistants (PDAs), and the like. As a particular example, wireless card 22 may take the form of a wireless local area networking (WLAN) card that conforms to a WLAN standard such as one or more of the IEEE 802.11(a), 802.11(b), 802.11(e) or 802.11(g) standards.

Figure 3:
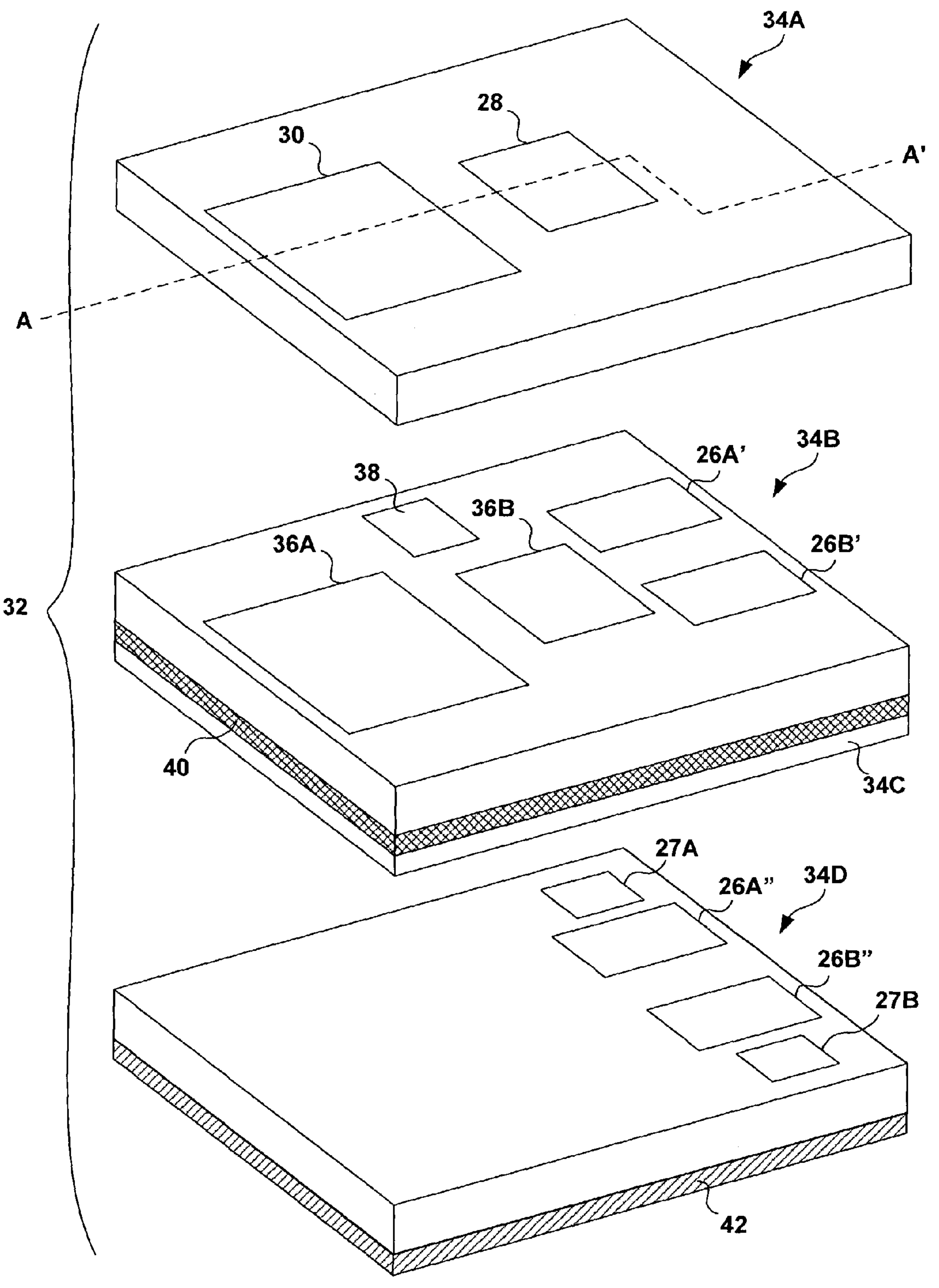
FIG. 3 is an exploded view of an exemplary integrated circuit (IC) package that incorporates at least one integrated circuit device with a passive radio frequency (RF) structure in accordance with the invention.

FIG. 3 is an exploded view of an exemplary IC package 32 that incorporates integrated circuits 28 and 30 with passive RF structures in accordance with the invention. As illustrated in the example of FIG. 3, IC package 32 includes multiple layers 34A–34D (hereinafter 34). IC package 32 may, for example, be a multi-layer ceramic package.

As discussed above, IC package 32 includes a radio IC 28 and a digital IC 30. Radio IC 28 and digital IC 30 are adjacent to one another and may reside within respective cavities formed within one of layers 34 and, more specifically, in the example of FIG. 3, layer 34A. The cavities within which radio IC 28 and digital IC 30 reside within may extend all the way through layer 34A or only a portion of the way through layer 34A. In the case in which the cavities within which radio IC 28 and digital IC 30 reside do not extend all of the way through layer 34A, a conductive via or other connection may be used to conductively couple radio IC 28 and digital IC 30 to other external or internal components. Alternatively, radio IC 28 and digital IC 30 may not reside within a cavity, but, instead, include one or more conductive extensions, e.g., pins, that electrically couple to conductive traces, a conductive pad, or other conductive connection residing on top side of layer 34A. Although in the example of FIG. 3, radio IC 28 and digital IC 30 reside on the same layer, in some embodiments, radio IC 28 and digital IC 30 may reside on different layers 34 of IC package 32.

In the example illustrated in FIG. 3, IC package 32 includes conductive pads 36A and 36B (hereinafter 36) on layer 34B. Pads 36 provide conductive bonding for radio IC 28 and digital IC 30. Specifically, radio IC 28 and digital IC 30 reside within respective cavities that extend all the way through layer 34A and electrically couple to a respective one of conductive pads 36. In this manner, radio IC 28 and digital IC 30 may be considered to reside on layer 34B and layer 34A may be "built" around radio IC 28 and digital IC 30. IC package 32 may include other active components such as a power amplifier, other integrated circuits, or the like.

IC package 32 incorporates at least one passive RF structure with radio IC 28 and digital IC 30. In the example illustrated in FIG. 3, IC package 32 incorporates baluns 26A and 26B, which as described above are exemplary passive RF structures. Baluns 26A and 26B may be multi-layer baluns as illustrated. More specifically, a portion of balun 26A and 26B may reside on a first layer and another portion of balun 26A and 26B may reside on a different layer. One or more layers may reside between the portions of baluns 26A and 26B. Using FIG. 3 as an example, balun 26A includes portion 26A' that resides on layer 34B and portion 26A" that resides on layer 34D.

Balun 26B is arranged in a similar manner, i.e., a portion 26B' resides on layer 34B and another portion 26B" resides on layer 34D. Although a ground plane 40 and layer 34C separate the portions of baluns 26 in the illustrated example, any number of layers may separate the portions of baluns 26. Layer 34C electrically isolates portions 26A" and 26B" from ground plane 40. Portions 26A' and 26A" may be electrically coupled by a conductive via that extends between layer 34B, ground plane 40 and layer 34C. In some embodiments, however, baluns 26 may be formed on a single layer of the multi-layer circuit package 32. As described above, baluns 26 may transform unbalanced (or single-ended) signals to balanced (or differential) signals, perform impedance transformations in addition to conversions from balanced signals to unbalanced signals, or provide filtering functionality to inbound and outbound signals. Although the example illustrated in FIG. 3 IC package 32 includes baluns 26, IC package 32 may only incorporate a single balun 26 or more than two baluns 26.

IC package 32 may further include other passive RF structures, such as filters 27A and 27B (hereinafter 27), in addition to baluns 26. Filters 27A and 27B couple to portions 26A" and 26B" of baluns 26, respectively. Filters 27 illustrated in FIG. 3 may be constructed from one or more conductive traces formed on dielectric layer 34B. Filters 27 may comprise notch filters, hairpin filters, or any other type of filter. IC package 32 may include other passive RF structures such as passive RF structure 39. Passive RF structure 38 may, for example, be a coupler, such as a line coupler or a quadrature coupler. Passive RF structure 38 may be formed from discrete passive components or conductive traces on a dielectric of layer 34B. IC package 32 may further include individual passive electronic components, such as resistors, capacitors and inductors.

Conductive traces, such as microstrip and stripline transmission lines, formed on each of layers 34 may interconnect baluns 26, radio IC 28, digital IC 30, filters 27 and passive RF structure 38 with one another. The conductive traces may be formed by any of a variety of fabrication techniques including chemical vapor deposition, sputtering, etching, photolithography, masking, and the like. Conductive vias may extend between the layers to electrically couple components of one layer to respective conductive traces that reside on a different layer.

Integrating passive RF structures, e.g., baluns 26 and filters 27, with ICs on a single IC chip facilitates input and output impedance matching of the different ICs and passive RF structures using conductive traces. Further, since the variance on dimensions and tolerance of the conductive traces is low, the variance on the overall performance of IC package 32 is low. This low variance increases the performance of the IC chips and holds that increased performance over a high production volume. Further, integration of power planes (not shown) and ground planes, such as ground plane 40, in close proximity of ICs 28 and 30 result in reduced distortion due to parasitic effects associated with surface mounting high speed or high frequency ICs on a printed circuit board.

IC package 32 further includes a conductive pad 42 to which all connections from IC chips 28, 30 and passive RF components, such as baluns 26, are routed to. Conductive pad 42 may, for example, be mounted on a printed circuit board and provide an interface that couples internal components, e.g., baluns 26, radio IC 28, and digital IC 30 to external components, such as an antenna or power source. Conductive pad 42 may, for example, be a ball grid array landing pad. Connection of conductive traces from antennas 24 to a section of conductive pad 42 in order to couple to baluns 26 are one example of internal and external components being coupled via conductive pad 42. Instead of a conductive pad 42, IC package 32 may have one or more conductive extensions, e.g., pins, that electrically couple to a printed circuit board in order to interface the internal components with external components.

Figure 4:
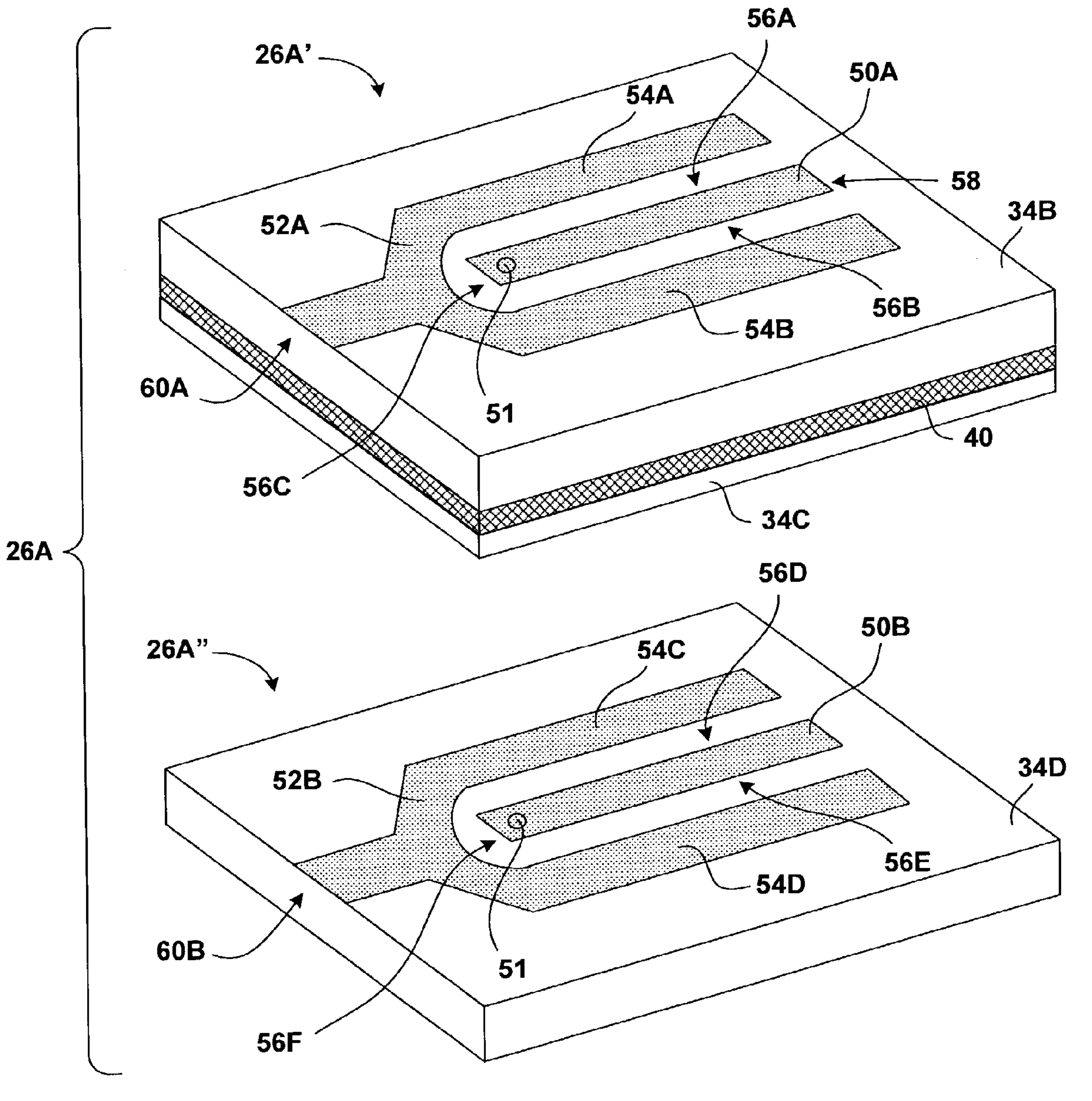
FIG. 4 is an exploded view illustrating a passive RF balun of FIG. 3 in further detail.

FIG. 4 is an exploded view illustrating balun 26A of FIG. 3 in further detail. As illustrated in FIG. 4, balun 26A has components formed on more than one layer of multilayer IC package 32. More specifically, balun 26A includes a first portion 26A' that resides on a first layer 34B and a second portion 26A" that resides on a second layer 34D.

Balun 26A comprises unbalanced components 50A and 50B (hereinafter 50) that may be electrically coupled to form an unbalanced balun structure. Unbalanced components 50 may, for example, be electrically coupled by a conductive via 51 that extends between multiple layers of multi-layer IC package 32. At least one of unbalanced components 50 is further coupled to an unbalanced port 58.

In the example illustrated in FIG. 4, unbalanced component 50A is coupled to unbalanced port 58. In some cases, however, unbalanced component 50B may be coupled to unbalanced port 58. In some embodiments, unbalanced components 50 may not be electrically coupled to one another. In this case, both unbalanced components 50 are coupled to an unbalanced port 58. Unbalanced components 50 may be conductive elements, such as conductive strips disposed on a dielectric layer.

Balun 26A further includes a balanced balun structure that includes balanced components 52A and 52B (hereinafter 52). Each of balanced components 52 is electromagnetically coupled to one of unbalanced components 50. Each balanced component 52 electromagnetically couples more than one side 56A–56F (hereinafter 56) of a corresponding unbalanced component 50. For example, as illustrated in FIG. 4, balanced component 52A electromagnetically couples sides 56A–56C of unbalanced component 50A and balanced component 52B electromagnetically couples sides 56D–56F of unbalanced component 50B.

Balanced components 52 may be constructed of balanced elements, such as balanced elements 54A–54D (hereinafter 54). For instance, balanced element 54A may be disposed on layer 34B adjacent to side 56A of unbalanced component 50 and balanced element 54B may be disposed on layer 34B adjacent to side 56B of the unbalanced component 50. Balanced elements 54 may be electrically coupled at one end to form balanced component 52. In this manner, balanced component 52 electromagnetically couples more than one side of unbalanced component 50. Each of balanced components 52 is coupled to a balanced port 60. More specifically, balanced component 52A is coupled to balanced port 60A and balanced component 52B is coupled to balanced port 60B.

Unbalanced component 50, which may also be a conductive strip, and balanced elements 54 may be of a length equal to approximately a quarter of a wavelength of an operating frequency of balun 26A. Further, the length and width of balanced elements 54 may be adjusted to achieve a desired impedance transformation between the balanced and unbalanced inputs.

Although balun 26A is described as being disposed on two layers, in some embodiments balun 26A may be disposed on more than two layers or only a single layer. Unbalanced component 50A and balanced component 52A may be formed by any of a variety of fabrication techniques. For instance, a conductive layer (not shown) may be deposited on layer 34B and shaped, e.g., by etching, to form unbalanced component 50A and balanced component 52A. More specifically, the conductive layer may be deposited on layer 34B using techniques such as chemical vapor deposition and sputtering. The conductive layer deposited on layer 34B may be shaped via etching, photolithography, masking, or a similar technique to form unbalanced component 50A and balanced component 52A. Alternatively, printing techniques may be used to deposit conductive traces on layer 34B. The conductive layer may include copper, aluminum, or other conductive material. Layer 34B may include a dielectric material such as silicon oxide, ceramic or other such material.

In the same manner, unbalanced component 50B and balanced component 52B may be formed on a top side of layer 34D. Layer 34C may be used to isolate unbalanced and balanced components 50B and 52B from ground plane 40. However, unbalanced component 50B and balanced component 52B may, instead, be disposed on a bottom side of a layer 34C in order to isolate unbalanced and balanced components 50B and 52B from a ground plane 40. Layer 34D would then be used to isolate unbalanced and balanced components 50B and 52B from the conductive pad 42 (FIG. 3). Further, unbalanced and balanced components 50A and 52A do not have to be disposed on different physical layers 34. For example, unbalanced and balanced components 50A and 52A may be disposed on an opposing side of the same dielectric layer as unbalanced and balanced components 50B and 52B.

As illustrated in FIG. 4, portions 26A' and 26A" of balun 26A may be oriented such that unbalanced component 50A is parallel with unbalanced component 50B. However, portions 26A' and 26A" may be oriented in any fashion. For example, portions 26A' and 26A" may be oriented such that unbalanced component 50A is perpendicular to unbalanced component 50B. Further, portions 26A' and 26A" may be oriented such that unbalanced balun component 50A substantially vertically aligns with unbalanced component 50B.

A ground plane 40 may be placed between layers 34B and 34D. Balanced components 52 of the balanced balun structure may be referenced to ground plane 58, i.e., carry a potential relative to ground plane 58. Conductive via 51 extends between unbalanced component 50A and unbalanced component 50B, i.e., through layer 34B, ground plane 40, and layer 34C to electrically couple unbalanced components 50.

As described above, balun 26A couples an unbalanced line or device with a balanced line or device. Balun 26A and, more particularly, unbalanced components 50 receive an unbalanced signal via unbalanced port 58. Balun 26A divides the received signal equally between balanced ports 60. More specifically, electromagnetic coupling between balanced components 52 and associated unbalanced components 50 induces signals on balanced components 52. For instance, an electromagnetic field from unbalanced component 50A radiates in all directions. Balanced component 52A, which electromagnetically couples more than one side 56 of unbalanced component 50A, induces a signal due to the electromagnetic coupling and transmits the signal via balanced port 60A.

Electromagnetically coupling more than one side of unbalanced component 50A allows more energy radiated from unbalanced component 50 to be coupled to balanced component 52A, resulting in reduction of energy loss and greater energy efficiency. A similar phenomenon occurs for unbalanced component 50B, balanced component 52B, and balanced port 60B. The signals output on each of balanced ports 60 are identical except for an approximate 180-degree phase shift. For example, the signal output from balanced port 60A may have a first phase and the signal output from balanced port 60B may have a second phase that is a 180-degrees out of phase relative to the phase of the signal output from balanced port 60A. The signals output via balanced ports 60 are fed to a balanced device, such as radio IC 28.

Signal flow also occurs in the opposite direction. Balanced components 52 each receive a balanced signal from a balanced device via corresponding balanced ports 60. Balun 26A combines the balanced signals to create an unbalanced signal and outputs the unbalanced signal to an unbalanced device, such as antenna 14, via unbalanced port 58. More particularly, electromagnetic coupling between balanced components 52 and corresponding unbalanced components 50 induce a signal on each of unbalanced components 50. The signals induced on each of unbalanced components 50 combine via the electric coupling between unbalanced components 50 and are output via unbalanced port 58. Balun 26B may be constructed and operate in a manner similar to balun 26A described above.

Figure 5:
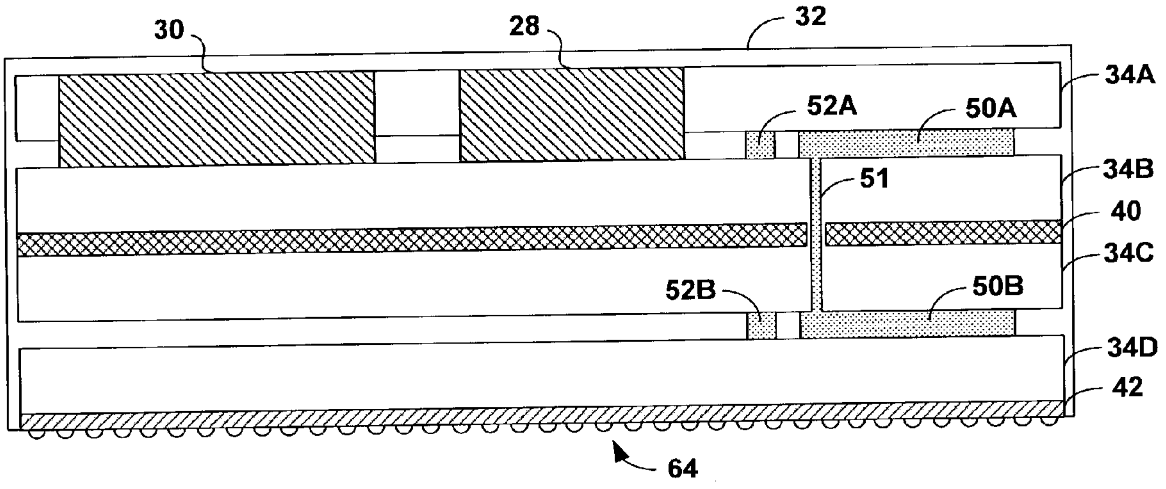
FIG. 5 is a schematic diagram illustrating a cross section view of the IC package of FIG. 3.

FIG. 5 is a schematic diagram illustrating a cross section view of IC package 32 of FIG. 3 from A to A'. As illustrated in FIG. 5, IC package 32 is a multi-layer package. More specifically, IC package 32 includes layers 34A–34D (hereinafter 34) as well as a ground plane 40 and a conductive pad 42.

A radio IC 28 and a digital IC 30 electrically couple to layer 34B and extend through layer 34A. Particularly, layer 34A may include cavities within which radio IC 28 and digital IC 30 reside. In this manner, layer 34A may be thought of as “built” around radio IC 28 and digital IC 30. As described above, radio IC 28 and digital IC 30 may electrically couple to layer 34B via one or more conductive pads 36, one or more conductive extensions, e.g., pins, that electrically couple to conductive traces, or the like.

IC package 32 further includes balun 26, which, as described above, constitutes a passive RF structure. Balun 26 may reside on more than one layer of IC package 32. Particularly, unbalanced components 50A and 50B of balun 26 are electrically coupled by a conductive via 51. As illustrated in FIG. 5, conductive via 51 extends between unbalanced component 50A and unbalanced component 50B through a layer 34B and 34C in addition to a ground plane 40.

Unbalanced component 50A and a balanced component 52A are disposed on a top portion of layer 34B. Unbalanced component 50B and balanced component 52B may be disposed on a bottom portion of dielectric layer 34C. Alternatively, unbalanced component 50B and balanced component 52B may be disposed on a top portion of layer 34D. As described above, unbalanced components 50 and balanced components 52 may be disposed on respective layers 34 by any of a variety of fabrication techniques.

Balanced components 52 may be referenced to a common ground plane 40, i.e., carry a potential relative to ground plane 40. Alternatively, each of balanced components 52 may be referenced to separate ground planes.

In the example of FIG. 5, unbalanced component 50A and unbalanced component 50B are oriented such that unbalanced components 50 are parallel with respect to one another. However, unbalanced components 50 may be oriented with respect to one another in any manner. For instance, unbalanced components 50 may be oriented such that unbalanced component 50A is perpendicular to unbalanced component 50B.

On a bottom face of IC package 32 is a conductive pad 42 to which all connections from IC chips 28, 30 and passive RF components, such as baluns 26, are routed to. Conductive pad 42 may, for example, be mounted on a printed circuit board and provide an interface that couples internal components, e.g., baluns 26, radio IC 28, and digital IC 30 to external components. In the example illustrated in FIG. 5, conductive pad 42 includes a ball grid array 64. Ball grid array 64 facilitates easy surface mounting of IC package 32 onto printed circuit structures, such as a printed circuit board. More specifically, ball grid array 64 is constructed such that it self-aligns IC package 32 when surface mounting onto printed circuit structures.

Radio IC 28, digital IC 30, and balun 26 may be dispersed anywhere throughout IC package 32. For example, a portion or all of balun 26 may reside on a same layer 34 as radio IC 28 and digital IC 30. Alternatively, all of balun 26 may reside on a different layer 34 from radio IC 28 and digital IC 30. In addition, radio IC 28 and digital IC 30 may reside on different layers within IC package 32.

Figure 6:
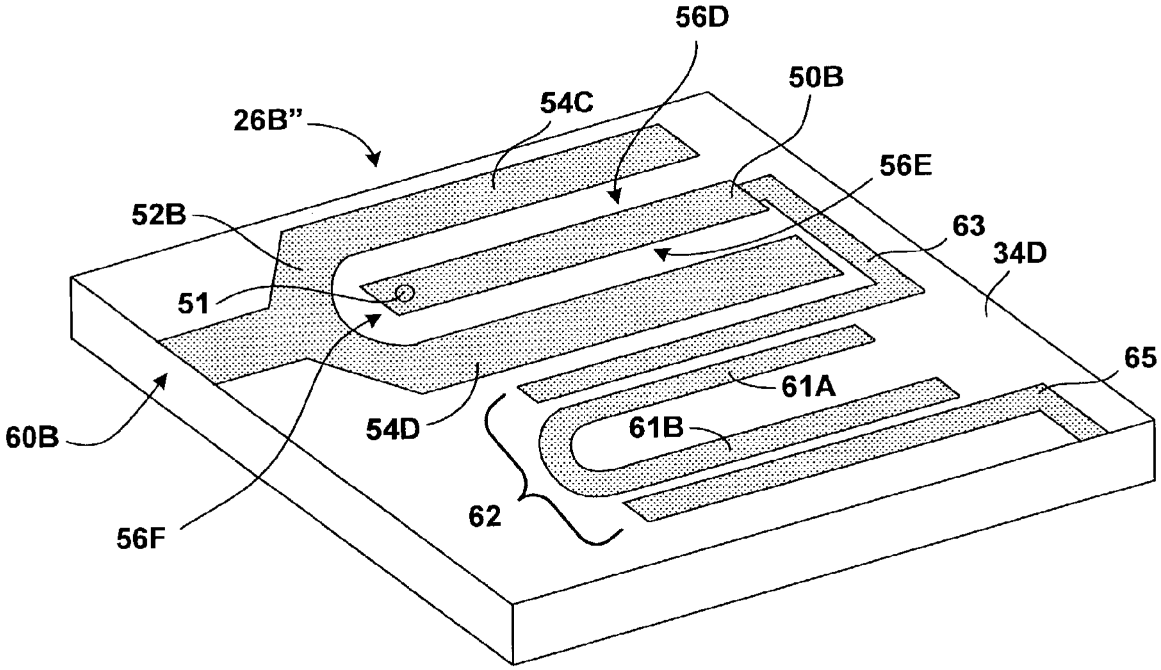
FIG. 6 is a schematic diagram illustrating a passive RF balun coupled to a hairpin filter.

FIG. 6 is a schematic diagram illustrating a portion of layer 34D of IC package 32 in further detail. The portion of layer 34D illustrated in FIG. 6 includes a portion 26B" of balun 26 electromagnetically coupled with a hairpin filter 62 via a conductive element 63. Another conductive element 65 electromagnetically couples hairpin filter 62 to an unbalanced component that may be within IC package 32 or external to IC package 32, such as an external antenna. Conductive elements 63 and 65 may, for example, comprise conductive traces. As illustrated, hairpin filter 62 is coupled to unbalanced component 50B of portion 26". Portion 26B" of balun 26 is described in detail in FIG. 4.

Hairpin filter 62 includes a U-shaped portion that comprises conductive elements 61A and 61B that electromagnetically couple to conductive elements 63 and 65. More specifically, conductive element 63 extends adjacent to balanced element 54D and electrically couples to unbalanced component 50B. Conductive element 61A of the U-shaped portion of hairpin filter 62 extends adjacent to conductive element 63 to electromagnetically edge couple conductive element 63. Hairpin filter 62 is further arranged such that conductive element 61B of the U-shaped portion of hairpin filter 62 electromagnetically edge couples to conductive element 65. In this manner, hairpin filter 62 filters signals inbound to and outbound from balun 26.

Hairpin filter 62 and, more specifically, conductive elements 61A may be designed to obtain particular operating frequencies. Particularly, the length and width of conductive elements 61 of hairpin filter 62 determine the operating frequency of hairpin filter 62.

Although the portion of layer 34D illustrated in FIG. 6 shows a hairpin filter, other types of filters may couple to balun 26. For example, balun 26 may be coupled to a notch filter that is formed from one or more conductive traces. Further, layer 34D may include other filters in addition to hairpin filter 62. For example, layer 34D may include a notch filter in addition to hairpin filter 62.

Figure 7:
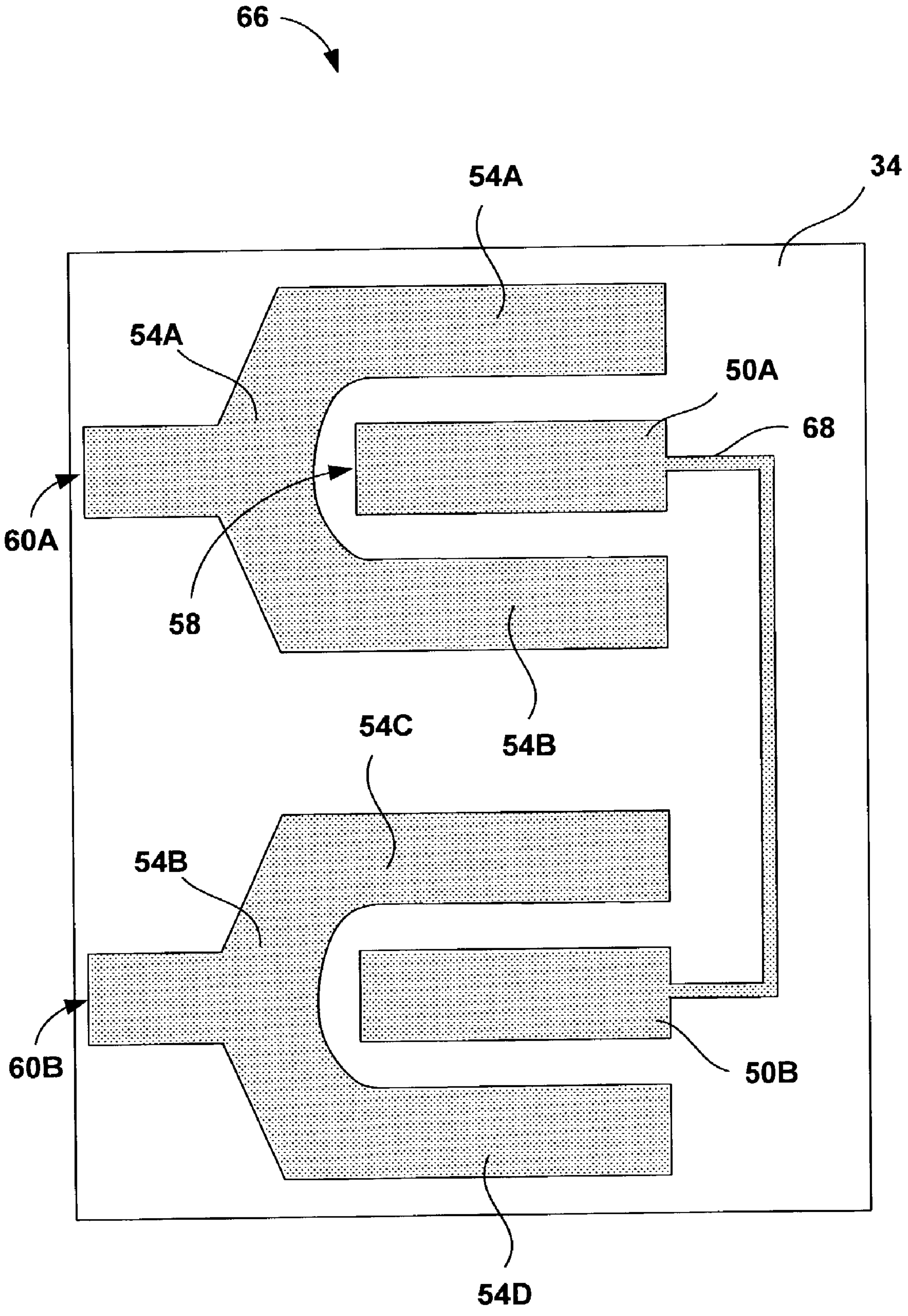
FIG. 7 is a block diagram illustrating another exemplary passive RF balun arranged on a single layer.

FIG. 7 is a block diagram illustrating another exemplary balun 66 arranged on a single layer 34. Balun 66 includes unbalanced components 50A and 50B (hereinafter 50) that are electrically coupled to form an unbalanced balun structure. Unbalanced components may be electrically coupled via a conductive strip 68 that extends from unbalanced component 50A to unbalanced component 50B.

Balun 66 further comprises a balanced balun structure that includes balanced components 52A and 52B (hereinafter 52). Balanced components 52 electromagnetically couple respective unbalanced components 50. More specifically, balanced component 52A electromagnetically couples more than one side of unbalanced balun component 50A and balanced component 52B electromagnetically couples more than one side of unbalanced balun component 50B.

Balanced components 52 may be constructed of balanced elements, such as balanced elements 54A–54D (hereinafter 54). For example, balanced component 52A may consist of a first balanced element 54A that electromagnetically couples a first side of unbalanced component 50A and a second balanced element 54B that electromagnetically couples a second side of unbalanced component 50A. Balanced elements 54A and 54B are electrically coupled to form balanced component 52A. Balanced component 54B may be constructed in a similar fashion using balanced elements 54C and 54D.

Each of balanced components 52 is coupled to a balanced port 60. More specifically, balanced component 52A is coupled to balanced port 60A and balanced component 52B is coupled to balanced port 60B. The unbalanced balun structure is coupled to an unbalanced port 58. More specifically, one or both of unbalanced components 50 is connected to unbalanced port 58.

Balun 66 operates in the same manner as balun 26A of FIG. 4. Unbalanced components 50 receive an unbalanced signal via unbalanced port 58 and divide the received signal equally between balanced ports 60 via electromagnetic coupling between balanced components 52 and associated unbalanced components 50. The signals output on each of balanced ports 60 are identical except for an approximate 180-degree phase shift. For example, the signal output from balanced port 60A may have a first phase and the signal output from balanced port 60B may have a second phase that is a 180-degrees out of phase relative to the phase of the signal output from balanced port 60A. The signals output via balanced ports 60 are fed to a balanced device, such as balanced radio IC 28 or a balanced antenna 24.

Various embodiments of the invention have been described. For example, the techniques of the invention may be used to incorporate passive structures that operate in different frequency ranges up to millimeter wave frequencies in an integrated circuit package. These and other embodiments are within the scope of the following claims.

The invention claimed is:

1. An integrated circuit package comprising:

at least one radio integrated circuit device;

a passive balun, the radio integrated circuit device being coupled to the passive balun; and a passive filter, wherein the passive filter comprises a hairpin filter.

2. The circuit package of claim 1, wherein the filter is electrically coupled to the balun.

3. The circuit package of claim 1, further comprising a notch filter.

4. The circuit package of claim 1, further comprising a passive coupler.

5. The circuit package of claim 1, wherein the passive balun comprises:

an unbalanced balun structure having a first unbalanced component and a second unbalanced component electrically coupled to one another; and a balanced balun structure having a first balanced component and a second balanced component, wherein the first balanced component electromagnetically couples more than one side of the first unbalanced component, and the second balanced component electromagnetically couples more than one side of the second unbalanced component.

6. The circuit package of claim 5, wherein the first unbalanced component and the first balanced component are disposed on a first layer of the integrated circuit package, and the second unbalanced component and the second balanced component are disposed on a second layer of the integrated circuit package.

7. The circuit package of claim 6, wherein one or more intermediate layers separate the first and second layers.

8. The circuit package of claim 5, wherein the first and second unbalanced components and the first and second balanced components are disposed on a single layer of the integrated circuit package.

9. The circuit package of claim 5, wherein at least one of the first and second unbalanced components is coupled to an unbalanced port.

10. The circuit package of claim 5, wherein the first balanced component is coupled to a first balanced port and the second balanced component is coupled to a second balanced port.

11. The circuit package of claim 5, wherein the first and second balanced components include:

a first balanced element that electromagnetically couples a first side of the unbalanced component; and a second balanced element that electromagnetically couples a second side of the unbalanced component, wherein the first balanced element and the second balanced element are electrically coupled.

12. The circuit package of claim 11, wherein the first and second balanced elements comprise conductive strips.

13. The circuit package of claim 5, wherein the first and second unbalanced components are oriented such that the first unbalanced component is parallel with the second unbalanced component.

14. The circuit package of claim 5, wherein the first and second unbalanced components comprise conductive strips.

15. The circuit package of claim 1, further comprising a conductive pad to which connections from the radio integrated circuit device and the passive balun electrically couple.

16. The circuit package of claim 15, wherein the conductive pad comprises a ball grid array.

17. The circuit package of claim 1, wherein the radio integrated circuit transmits and receives inbound and outbound radio frequency signals.

18. The circuit package of claim 1, wherein the radio integrated circuit and the passive balun reside at least partially on the same layer.

19. The circuit package of claim 1, further comprising at least one passive electronic component.

20. The circuit package of claim 19, wherein the passive electronic component comprises one of a resistor, a capacitor and an inductor.

21. The circuit package of claim 1, wherein the integrated circuit package comprises a multi-layer ceramic integrated circuit package.

22. The circuit package of claim 1, wherein the integrated circuit package operates in a radio frequency range.

23. An integrated circuit package comprising:

at least one radio integrated circuit device;

a passive balun, the radio integrated circuit device being coupled to the passive balun;

a passive filter; and a digital integrated circuit that processes inbound and outbound baseband frequency signals.

24. An integrated circuit package comprising:

a radio integrated circuit that converts radio frequency signals to baseband signals;

a digital integrated circuit that processes the inbound and outbound baseband frequency signals; and a passive structure coupled to the radio integrated circuit, wherein the passive structure includes a passive balun and a passive filter.

25. The package of claim 24, wherein the passive balun includes:

an unbalanced balun structure having a first unbalanced component and a second unbalanced component electrically coupled to one another; and a balanced balun structure having a first balanced component and a second balanced component, wherein the first balanced component electromagnetically couples more than one side of the first unbalanced component, and the second balanced component electromagnetically couples more than one side of the second unbalanced component.

26. The package of claim 25, wherein the first unbalanced component and the first balanced component are disposed on a first layer of the integrated circuit package, and the second unbalanced component and the second balanced component are disposed on a second layer of the integrated circuit package.

27. The package of claim 25, wherein the first and second unbalanced components and the first and second balanced components are disposed on a single layer of the integrated circuit package.

28. The package of claim 24, wherein the balun is electrically coupled to the passive filter.

29. The package of claim 24, wherein the passive filter comprises one of a notch filter and a hairpin filter.

30. The package of claim 24, wherein the passive structure comprises a passive coupler.

31. The package of claim 24, wherein the multi-layer integrated circuit package further includes a passive electrical component.

32. The package of claim 24, wherein the passive electrical component comprises one of a capacitor, a resistor, and an inductor.

33. The package of claim 24, wherein the integrated circuit package comprises a multi-layer ceramic package.

34. The package of claim 24, further comprising conductive traces that interconnect the radio integrated circuit, the digital integrated circuit and the passive structure.

35. The package of claim 24, wherein the multi-layer integrated circuit package includes a conductive pad to which connections from the radio integrated circuit, the digital integrated circuit and the passive structure electrically couple.

36. The package of claim 35, wherein the conductive pad comprises a ball grid array.

37. The package of claim 24, wherein the integrated circuit package operates in a radio frequency range.

38. A device comprising:

an integrated circuit package;

a radio integrated circuit within the integrated circuit package;

a digital integrated circuit within the integrated circuit package;

a passive balun within the integrated circuit package, wherein the radio integrated circuit is coupled to the passive balun; and a passive filter within the integrated circuit package.

39. The device of claim 38, wherein the passive filter includes a hairpin filter or a notch filter, and is coupled to the balun.

40. A n integrated circuit package comprising:

at least one radio integrated circuit device; and a passive balun, the radio integrated circuit device being coupled to the passive balun, wherein the passive balun comprises:

an unbalanced balun structure having a first unbalanced component and a second unbalanced component electrically coupled to one another; and a balanced balun structure having a first balanced component and a second balanced component, wherein the first balanced component electromagnetically couples more than one side of the first unbalanced component, and the second balanced component electromagnetically couples more than one side of the second unbalanced component.

41. The circuit package of claim 40, wherein the first unbalanced component and the first balanced component are disposed on a first layer of the integrated circuit package, and the second unbalanced component and the second balanced component are disposed on a second layer of the integrated circuit package, wherein one or more intermediate layers separate the first and second layers.

42. The circuit package of claim 40, wherein the first and second unbalanced components and the first and second balanced components are disposed on a single layer of the integrated circuit package.

43. The circuit package of claim 40, wherein the first and second balanced components include:

a first balanced element that electromagnetically couples a first side of the unbalanced component; and a second balanced element that electromagnetically couples a second side of the unbalanced component, wherein the first balanced element and the second balanced element are electrically coupled.

44. The circuit package of claim 40, further comprising a passive filter electrically coupled to the balun, wherein the passive filter comprises a hairpin filter or a notch filter.

* * * * *